United States Patent

Banh

[11] Patent Number: 6,091,939
[45] Date of Patent: Jul. 18, 2000

[54] MOBILE RADIO TRANSMITTER WITH NORMAL AND TALK-AROUND FREQUENCY BANDS

[75] Inventor: An Tuyen Banh, Raleigh, N.C.

[73] Assignee: Ericsson Inc., Research Triangle Park, N.C.

[21] Appl. No.: 08/800,450

[22] Filed: Feb. 18, 1997

[51] Int. Cl.⁷ .................................................. H04B 1/02
[52] U.S. Cl. ........................... 455/102; 455/103; 375/261
[58] Field of Search ..................... 455/102, 103, 455/118, 517, 550, 552, 553; 375/261, 262

[56] References Cited

U.S. PATENT DOCUMENTS

| | | | |
|---|---|---|---|
| 5,373,265 | 12/1994 | Davis et al. | 455/102 |
| 5,438,684 | 8/1995 | Schwent et al. | 455/553 |
| 5,519,732 | 5/1996 | Chester | 455/103 |
| 5,717,719 | 2/1998 | Park et al. | 455/118 |

FOREIGN PATENT DOCUMENTS

| | | |
|---|---|---|
| 0 469 898 A2 | 2/1992 | European Pat. Off. . |
| 0 581 573 A1 | 2/1994 | European Pat. Off. . |
| 0 678 974 A2 | 10/1995 | European Pat. Off. . |
| 0 700 167 A1 | 3/1996 | European Pat. Off. . |
| WO 96/10871 | 4/1996 | WIPO . |

*Primary Examiner*—Fan Tsang
*Assistant Examiner*—Congvan Tran
*Attorney, Agent, or Firm*—Nixon & Vanderhye P.C.

[57] ABSTRACT

A transmitter circuit for use in a mobile radio using both a normal frequency transmission band and a talk-around frequency transmission band is disclosed. The transmitter employs a local oscillator in the modulation circuit that operates at only a single frequency band characteristic. At the output of the modulation circuit, one of two transmission paths is selected by an RF switch. In the normal transmission path, the input signal is output in the normal frequency band. Alternatively, in the talk-around transmission path, the input signal is modulated to the talk-around frequency band and then output. The present circuitry eliminates the requirement for local oscillators having dual operational characteristics.

24 Claims, 5 Drawing Sheets

Fig. 5

MOBILE RADIO TRANSMITTER WITH NORMAL AND TALK-AROUND FREQUENCY BANDS

FIELD OF THE INVENTION

The present invention relates to broadcast transmitters, such as mobile radios, in a communication system. More particularly, the present invention relates to transmitters that operate on normal and talk-around frequency bands.

BACKGROUND OF THE INVENTION

In mobile radio systems, radios can be equipped with transmitters that operate on two different frequency bands. When the radio operates in one frequency band, the radio transmits directly to another mobile radio in the communication network. In the alternative frequency band, the radio transmits to a base station used in the communication network.

When a mobile radio communicates directly with another radio, it does so by transmitting in the so-called "talk-around" frequency band. Alternatively, when the radio communicates with the base station, it does so by transmitting in the so-called "normal" frequency band. For example, in an 800 MHz mobile radio system, a mobile radio will transmit to the base station in a normal frequency band that covers 806–824 MHz. Alternatively, when the radio communicates directly with other radios, it transmits in the talk-around frequency band covering 851–869 MHz. Of course, these normal and talk-around frequency bands are not the only possible frequency bands available for normal and talk-around transmissions. For example, a 900 MHz mobile radio system uses 896–902 MHz as the normal frequency band and 935–941 MHz as the talk-around frequency band. Other normal and talk-around frequency bands can also be employed.

Figure 1:
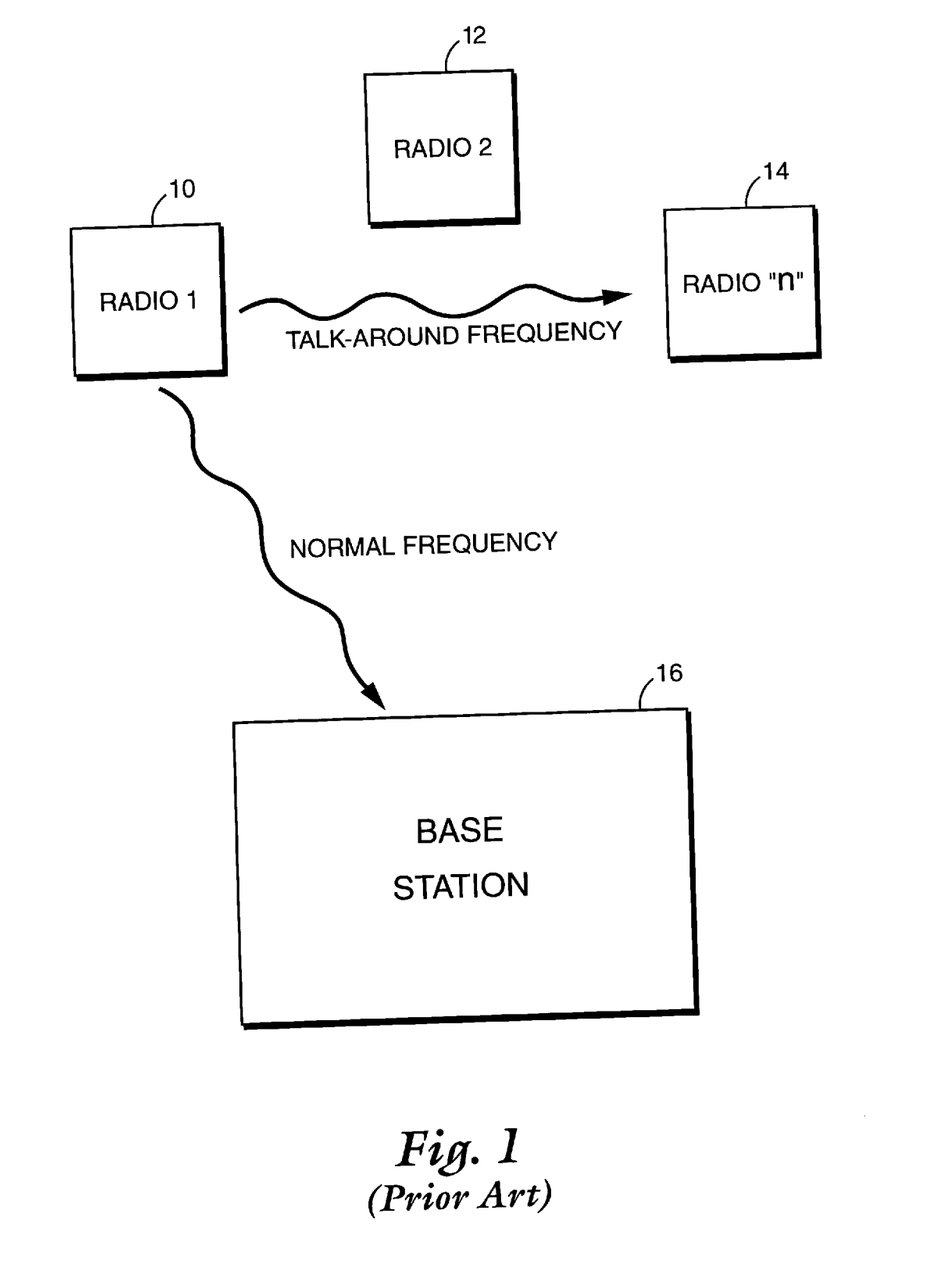
FIG. 1 is a schematic diagram of a prior art mobile radio communication system.

In FIG. 1, a plurality of mobile radios, radio 1, radio 2, ... radio n (10, 12, 14) communicate with each other in a mobile radio communication system including base station 16. In normal communications, when radio 1 (10) communicates with radio n (14), radio 1 communicates its message to base station 16 in the normal frequency band, and base station 16 relays the message to radio n in the normal frequency band.

Under certain conditions, such as when radio 1 is no longer proximate to base station 16, interference prevents radio 1 from communicating with base station 16, or some other situation prevents or hampers communication between radio 1 and base station 16, then radio 1 can switch from the normal frequency band to the talk-around frequency band to communicate directly with radio n (14). In the talk-around situation, the base station 16 is out of the communication loop, such that radio 1 and radio n communicate directly with each other in the talk-around frequency band.

For radios that have talk-around capability, circuitry must be provided within their transmitters to switch between the normal frequency transmission mode and the talk-around frequency transmission mode. That is, when the talk-around conditions are imposed or detected, radio 1 (10) must include circuitry in its transmitter to switch from transmitting in the normal frequency band to transmitting in the talk-around frequency band. Prior art circuitry for accomplishing that transition from normal frequency transmission to talk-around frequency transmission (and viceversa) is shown in FIGS. 2 and 3.

Figure 2:
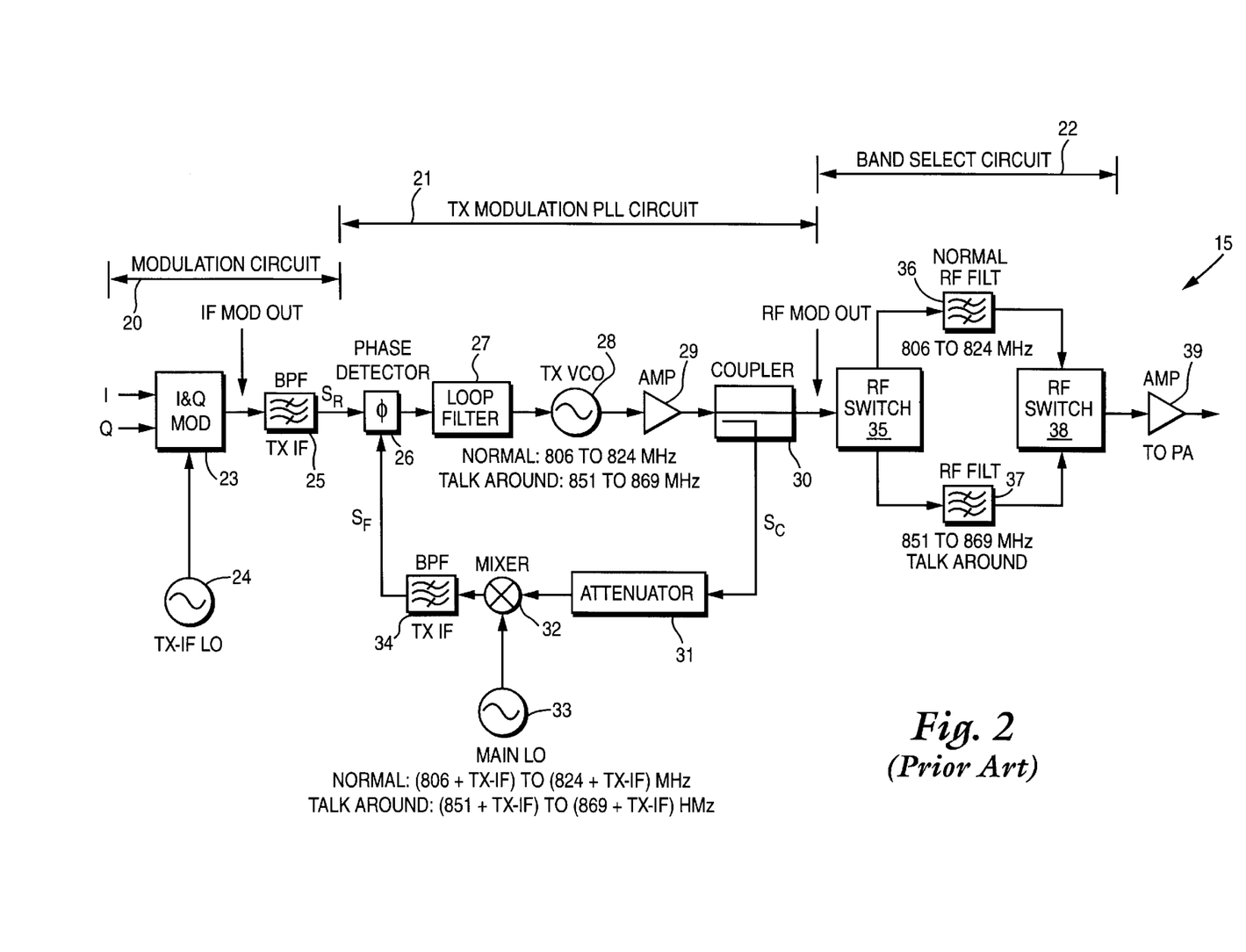
FIGS. 2 and 3 are schematic diagrams of prior art transmission circuits.
Figure 3:
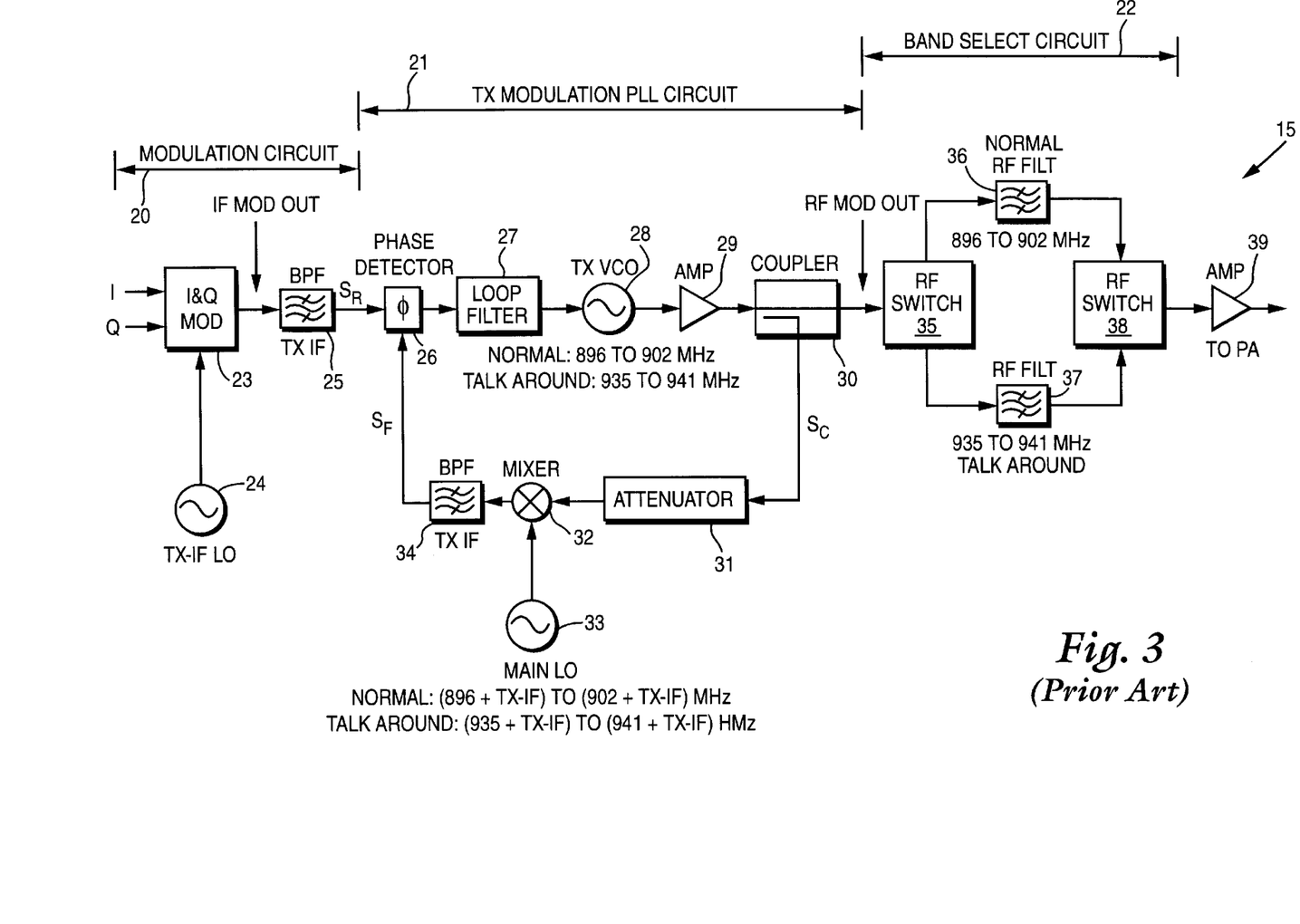

As can be seen by comparing FIGS. 2 and 3, the transmitter circuit for these two prior art transmitters is identical, with the exception of the frequency ranges employed by them. FIG. 2 relates to a 800 MHz mobile radio and FIG. 3 relates to a 900 MHz mobile radio.

In FIG. 2, a transmitter circuit 15 is shown in three stages, the modulation circuit 20, the transmission modulation phase lock loop circuit 21, and the band select circuit 22. Within the modulation circuit 20, the input signals I and Q, which are desired to be transmitted, are input to an I and Q modulator 23 where they are mixed with an intermediate frequency signal from the transmission IF local oscillator 24. The output of the I and Q modulator 23 (IF MOD OUT) will be the I and Q signals modulated to the intermediate frequency. From there, the modulated intermediate frequency signal is input to a band pass filter 25 to remove out-of-band spurs and to provide the reference signal $S_R$ at the intermediate frequency.

In the transmission modulation phase lock loop circuit 21, a phase detector 26, loop filter 27, transmission voltage control oscillator 28, amplifier 29, and coupler 30 are provided in a forward path, and an attenuator 31, mixer 32, main local oscillator 33, and band pass filter 34 are provided in a feedback loop. Both the transmission voltage control oscillator 28 and the main local oscillator 33 have dual operating characteristics. That is, when the radio is operating in the normal frequency mode (i.e., communicating with the base station 16), the transmission voltage control oscillator 28 operates in a frequency band from 806 to 824 MHz and the main local oscillator 33 operates at a frequency in the range of 806 plus the intermediate frequency of local oscillator 24 through 824 plus the intermediate frequency of local oscillator 24 MHz, i.e., the normal frequency band incremented by the intermediate frequency. Alternatively, in talk-around mode, when the radio communicates directly with another radio, the TX voltage control oscillator 28 operates in a frequency range of 851 to 869 MHz, and the main local oscillator 33 operates in a range of 851 plus the intermediate frequency from local oscillator 24 through 869 plus the intermediate frequency of the local oscillator 24 MHz, i.e., the talk-around frequency band incremented by the intermediate frequency.

The operation of the transmission modulation phase lock loop circuit 21 is as follows: when the phase lock loop is locked, the transmission voltage control oscillator 28 operates at the normal frequency band from 806 to 824 MHz. The signal from voltage control oscillator 28 is then amplified by amplifier 29 and supplied to coupler 30. Coupler 30 outputs the resulting signal at the RF Mod Out point on FIG. 2, as well as on the coupled output of coupler 30, as signal $S_C$.

On the feedback path, $S_C$ is attenuated in attenuator 31 and then mixed in mixer 32 with a signal from the main local oscillator 33. Since the transmitter is operating in normal frequency mode (i.e., the phase look loop is locked), the main local oscillator 33 is operating at the normal frequency band incremented by the intermediate frequency from the local oscillator 24. The output of the mixer 32 (after passing through band pass filter 34 for filtering) will be a feedback signal $S_F$ at the same intermediate frequency as was provided at the output of the band pass filter 25 (signal $S_R$).

Both $S_R$ (from modulation circuit 20) and the feedback signal $S_F$ (from the feedback loop) are input to the phase detector 26. The phase detector 26 compares the feedback signal $S_F$ with the reference signal $S_R$ to generate an error voltage. The error voltage passes through the loop filter to generate the control voltage for the transmission voltage control oscillator. As a result, the transmission voltage control oscillator 28 has the same modulation as the reference signal $S_R$ but operated at the desired transmit frequency.

When the radio transitions into the talk-around mode, the operation of the modulation phase lock loop circuit 21 is as described above, except that the transmission voltage control oscillator 28 and the main local oscillator 33 transition into different operational characteristics. In the talk-around mode, the transmission voltage control oscillator 28 operates at the talk-around frequency band (851 to 869 MHz in FIG. 2) and the main local oscillator 33 operates in the frequency band of (851 plus the intermediate frequency from the local oscillator 24) through (869 plus the intermediate frequency from the local oscillator 24) MHz. Otherwise, the operation is the same as described with respect to the normal mode above.

The transmission modulation phase lock loop circuit 21 is only operational for phase modulation with a constant envelope. Thus, the circuit shown in FIG. 2 is not adaptable to other kinds of modulation other than constant envelope phase modulation.

Significantly, the transmission modulation phase lock loop circuit 21 employs a main local oscillator 33 which must be operational at two different frequency band characteristics: the normal frequency band incremented by the IF frequency and the talk-around frequency band incremented by the IF frequency. Similarly, the transmission voltage control oscillator 28 must also be capable of operating in two different frequency band characteristics: the normal frequency band and the talk-around frequency band. Because these oscillators must be capable of operating in dual operational modes, the oscillators are larger and more costly than single characteristic oscillators.

The final stage of the transmitter 15 is the band select circuit 22. The band select circuit 22 includes two RF switches 35 and 38 and two RF filters 36 and 37. The RF modulation output from the coupler 30 is provided to the band select circuit 22 at the RF switch 35. Depending upon the position of the RF switch 35 (either normal mode or talk-around mode), the RF switch 35 directs the RF modulation output signal to either RF filter 36 (for normal transmission mode) or RF filter 37 (for talk-around transmission mode). RF filters 36 and 37 are adapted to filter high and low frequencies on either side of, respectively, the normal frequency band (filter 36) or the talk-around frequency band (filter 37). The signal from the filter 36 or 37 is then provided to RF switch 38 for output to the amplifier 39 and ultimately to the antenna for transmission to either another radio 12, 14 (in talk-around transmission mode) or the base station 16 (in normal transmission mode). RF switches 35 and 38 operate in tandem such that the RF modulation output signal from the coupler 30 is connected to the amplifier 39 through only one of the two RF filters 36 and 37. That is, the RF modulation output signal will pass either through the normal transmission path (filter 36) or the talk-around transmission path (filter 37) as a result of the operation of the RF switches 35 and 38.

FIG. 3 is identical to FIG. 2, except that the operation of the transmitter 15 is designed for a 900 MHz mobile radio. In the embodiment of FIG. 3, the normal frequency band is 896 to 902 MHz and the talk-around frequency band is 935 to 941 MHz. Accordingly, the transmission voltage control oscillator 28 operates in two modes, normal and talk-around, at these respectively frequency bands. Similarly, main local oscillator 33 also operates in two frequency bands, normal and talk-around, at the respective normal and talk-around frequency bands incremented by the intermediate frequency of the local oscillator 24. In addition, RF filter 36 in the normal transmission path operates at the normal frequency band and the RF filter 37 in the talk-around transmission path operates in the talk-around frequency band. Otherwise, the operational characteristics of the transmitter 15 in FIG. 3 are identical to those described with respect to FIG. 2 above.

Unfortunately, the transmitter circuits 15 of FIGS. 2 and 3, which implement the prior art embodiments, require a voltage control oscillator 28 that operates with two different frequency band characteristics and a main local oscillator 33 which also operates with two frequency band characteristics. That is, these oscillators must be switchable from the normal frequency band operation to a talk-around frequency band operation, depending upon whether the transmitter 15 is operating in the normal or talk-around mode. Such dual characteristic oscillators are disadvantageous because they are bulky and expensive. In addition, the transmitters 15 in FIGS. 2 and 3 have limited use with only constant envelope phase modulation. Other kinds of modulation cannot be used in the FIG. 2 and FIG. 3 prior art embodiments.

SUMMARY OF THE INVENTION

The present invention employs a transmitter in which the dual characteristic voltage control oscillators and dual characteristic local oscillators in the phase lock loop circuit are eliminated. Instead, the preferred embodiment of the present invention employs single characteristic oscillators, yet retains the ability to transmit in a normal frequency band or, alternatively, in a talk-around frequency band.

In accordance with the preferred embodiment of the present invention, the modulation stages of the transmitter modulate the input signal to the normal frequency band. Then, the modulated signal in the normal frequency band is switched to either a normal transmission path or a talk-around transmission path. In the normal transmission path, the modulated input signal is attenuated, amplified and filtered before being transmitted by the antenna. In the talk-around transmission path, the modulated input signal is modified to the talk-around frequency band and then output to the antenna.

With the present invention, the dual characteristic oscillators required by the FIGS. 2 and 3 prior art transmitters are eliminated, thus avoiding the relatively expensive and large dual characteristic oscillators. In addition, the present embodiment can be used with any type of modulation, and is not limited to the constant envelope phase modulation of the FIGS. 2 and 3 prior art transmitters.

BRIEF DESCRIPTION OF THE DRAWINGS

These, as well as other objects and advantages of this invention, will be more completely understood and appreciated by careful study of the following more detailed description of a presently preferred exemplary embodiment of the invention taken in conjunction with the accompanying drawings, of which.

DETAILED DESCRIPTION OF THE PRESENTLY PREFERRED EMBODIMENT

Figure 4:
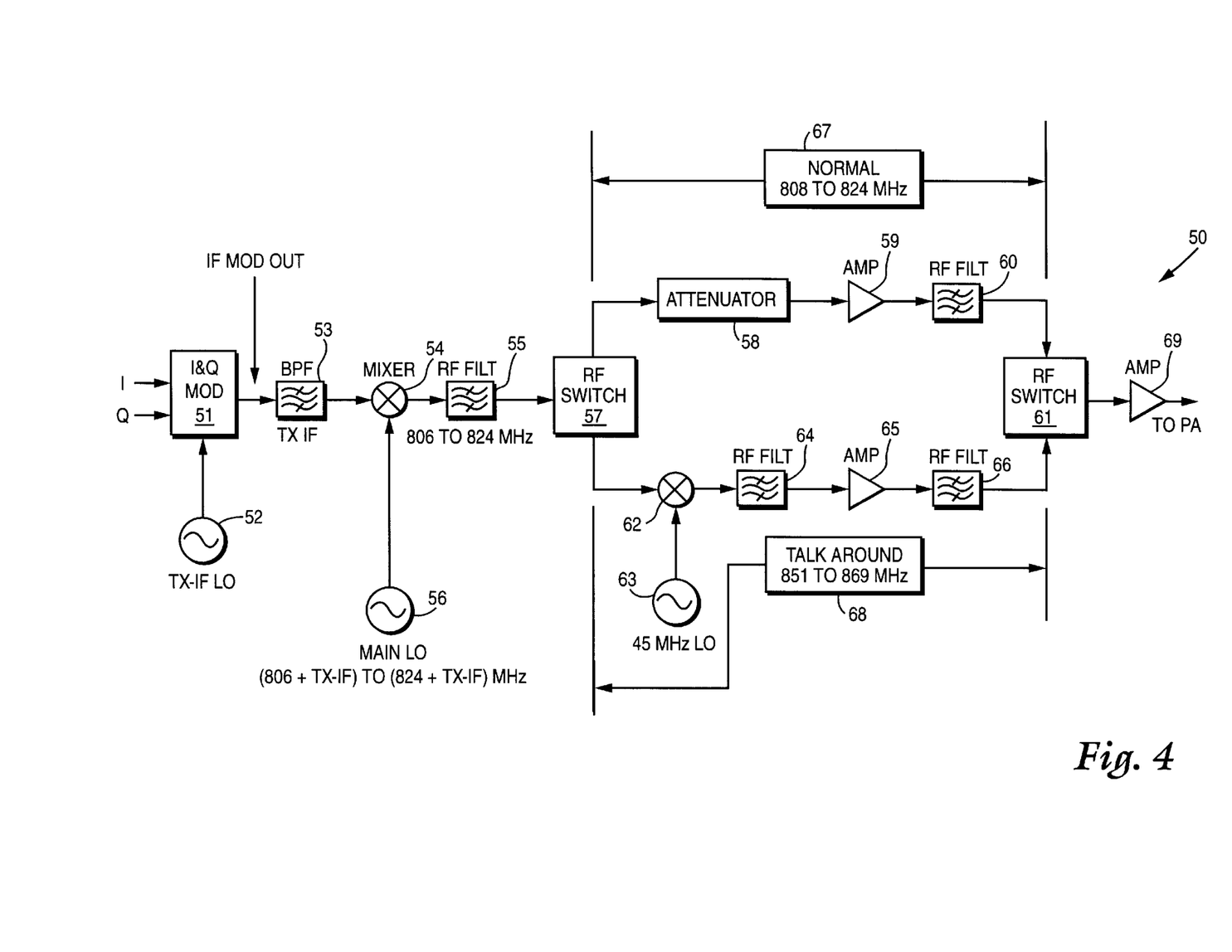
FIGS. 4 and 5 are schematic diagrams of transmission circuits according to the presently preferred embodiments of the present invention.
Figure 5:
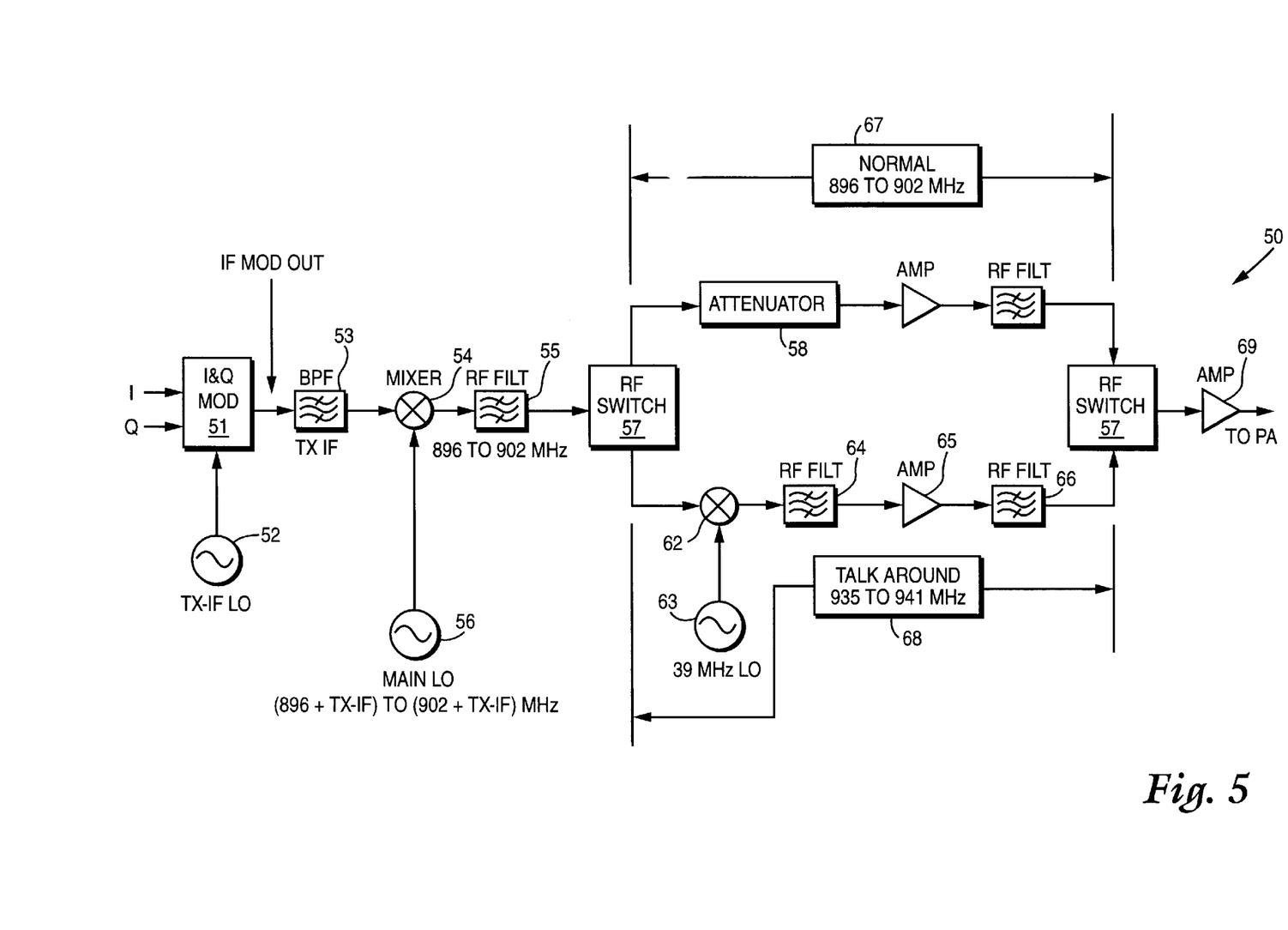

The presently preferred embodiments of the present invention are illustrated in FIGS. 4 and 5. In FIGS. 4 and 5, like numerals indicate like components. FIGS. 4 and 5 are also identical to each other, with the exception of the frequencies at which the respective transmitters 50 operate, as indicated on the respective Figures.

Referring to FIG. 4, the input signal desired to be transmitted is input as I and Q signals into I and Q modulator 51. In some embodiments, the I and Q modulator 51 provides vector modulation, in which case any type of modulation can be used in the transmitter 50. This is not the case with respect to the prior art design of FIGS. 2 and 3, which are limited to constant envelope phase modulation. The input signals I and Q are modulated in the I and Q modulator 51 with a signal from intermediate frequency local oscillator 52 to obtain the IF modulation output signal at the output of the I and Q modulator 51. The IF MOD OUT signal is the input signal I and Q modulated to the intermediate frequency.

The IF modulation output signal is provided to a band pass filter 53 to remove spurious signals away from the intermediate frequency band. It is then provided to the mixer 54 which brings the modulated input signal from the intermediate frequency up to the normal frequency band by mixing it with an appropriate signal from the main local oscillator 56. In the present case, the normal frequency band is 806 to 824 MHz, thus the main local oscillator 56 operates at a frequency band of 806 to 824 MHz incremented by the intermediate frequency of the local oscillator 52. The output of the mixer 54 is the desired input signal modulated to the normal frequency band. This signal is provided to the RF filter 55 to filter out spurious signals outside of the normal frequency band.

The input signal modulated to the normal frequency band is then input to the RF switch 57, where it is switched to either the normal transmission path 67 or the talk-around transmission path 68. The RF switch 57 operates in conjunction with the RF switch 61 to complete only one circuit path, either the normal path 67 or the talk-around path 68, depending upon whether the radio 10 is operating in the normal frequency band to the base station 16 or the talk-around frequency band to radio n (FIG. 1). Thus, during normal transmission mode, the talk-around transmission path 68 is inactive. Alternatively, during talk-around transmission mode, the normal transmission path 67 is inactive.

In a normal transmission mode, the input signal, which is provided from the RF filter 55 in the normal frequency band, passes through RF switch 57 to the normal transmission path 67. In the normal transmission path 67, an attenuator 58, amplifier 59, and RF filter 60 are provided. These components serve to remove any out of band spurs from the modulated input signal. In the embodiment of FIG. 4, the normal transmission path 67 does not further modulate the input signal since the signal received by the RF switch 57 is already the input signal modulated to the normal frequency band. Thus, the signal from the normal transmission path 67 to the RF switch 61 (and ultimately to the antenna via the amplifier 69) is passed through with only appropriate amplification and filtering.

The talk-around path 68 includes mixer 62, connected to the RF switch 57 to receive the modulated input signal at the normal frequency band. A fixed frequency local oscillator 63 also feeds into the mixer 62. The mixer 62 outputs a signal to an RF band pass filter 64 which, in turn, outputs to an amplifier 65, RF filter 66 and RF switch 61. In operation, the modulated input signal at the normal frequency band is provided to the talk-around path 68 by the RF switch 57. The input signal is received by the mixer 62 which up-converts the frequency band by a fixed frequency. In the case of FIG. 4, the fixed frequency is 45 MHz, thus up converting the normal frequency band of 806 to 824 MHz to the talk-around frequency band of 851 to 869 MHz. The output of the mixer 62 is thus the input signal modulated to the talk-around frequency band. This signal is then provided to RF filter 64, amplifier 65, and RF filter 66 to suppress unwanted out-of-band spurs. Finally, the talk-around band signal is provided to the amplifier 69 and ultimately to the antenna via the RF switch 61.

The present invention is not limited to any particular frequency bands. Thus, for example, FIG. 5 illustrates an identical circuit as that shown in FIG. 4, except that the transmitter 50 is tuned to a 900 MHz operational characteristic, rather than the 800 MHz operational characteristic of FIG. 4. Thus, in FIG. 5, the main local oscillator 56 operates in the range of 896 to 902 MHz incremented by the intermediate frequency of the local oscillator 52. The RF filter 55 operates in the normal frequency band of 896 to 902 MHz. Finally, the fixed frequency local oscillator 63 increments the normal frequency band signal from the RF switch 57 by the fixed value of 39 MHz in order to yield the talk-around frequency band of 935 to 941 MHz. FIGS. 4 and 5 are simply preferred embodiments of the present inventions and additional embodiments at the same or significantly different frequency ranges are equally plausible and within the realm of the present invention.

In an alternative embodiment, the main local oscillator 56 and RF filter 55 can operate at a frequency different from the normal frequency band. In this case, the normal transmission path 67 would resemble the structure of the talk-around transmission path 68, except that the local oscillator 63 used in the normal transmission path 67 would operate at a fixed frequency different from the local oscillator 63 employed in the talk-around transmission path 68. In particular, the local oscillator operating in the normal transmission path 67 would increment the frequency band received by the RF switch 57 to the normal frequency band, while the local oscillator 63 in the talk-around transmission path 68 would increment the frequency band received by the RF switch 57 to the different talk-around frequency band. For example, if RF filter 55 output a frequency band in the range of 706 to 724 MHz in the embodiment of FIG. 4, then the normal transmission path 67 would include a local oscillator operating at 100 MHz feeding a mixer in order to achieve the normal frequency band of 806 to 824 MHz. Similarity, the talk-around transmission path 68 would include a local oscillator 63 operating at 145 MHz in order to bring the frequency band received by the RF switch 57 up to the talk-around frequency band of 851 to 869 MHz.

In each of the above embodiments, the local oscillators are not required to operate at two different frequency band characteristics. Thus, the oscillators of the present invention are smaller and less costly than the oscillators employed in the embodiments of FIGS. 2 and 3. The main local oscillator 56 of the embodiment of FIGS. 4 and 5 need only operate in the normal frequency band instead of in both the normal and talk-around frequency bands, as required by the local oscillator 33 of the embodiments of FIGS. 2 and 3. In addition, the fixed frequency local oscillator 63 of FIGS. 4 and 5 operates at only a single frequency, unlike the IX voltage control oscillator 28 in the embodiments of FIGS. 2 and 3, which must operate in both the normal and talk-around frequency bands. In both cases, the oscillators employed by the embodiments of FIGS. 4 and 5 are smaller and less costly than the oscillators employed by the embodiments of FIGS. 2 and 3.

In addition, the transmitter 50 of FIGS. 4 and 5 can be used with any modulation scheme, while the transmitter 15 of FIGS. 2 and 3 is limited to constant envelope phase modulation.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A transmitter for communicating with a remote mobile radio directly to the mobile radio at a talk-around frequency range or through a common base station at a normal frequency range, comprising:

a switch to select one of the talk-around or normal frequency ranges;

a modulator to input a desired signal, modulate the desired signal, and output the modulated desired signal as an intermediate signal;

a first transmission path, communicating with the modulator through the switch, to input the intermediate signal and to output the intermediate signal at the normal frequency range to the mobile radio, when the switch selects the normal frequency range;

a second transmission path, independent of the first transmission path, communicating with the modulator through the switch, to input the intermediate signal, modulate the intermediate signal to the talk-around frequency range, and output the intermediate signal at the talk-around frequency range to the common base station, when the switch selects the talk-around frequency range;

a transmission antenna to receive the intermediate signal at said one of the talk-around or normal frequency ranges from a corresponding one of the first or second transmission paths, and to transmit the received intermediate signal to a corresponding one of said base station and mobile radio.

2. A transmitter according to claim 1, wherein the first transmission path inputs the intermediate signal, modulates the intermediate signal to the normal frequency range, and outputs the intermediate signal at the normal frequency range.

3. A transmitter according to claim 1, wherein the modulator modulates the desired signal to the normal frequency range.

4. A transmitter according to claim 3, wherein one of said first and second transmission paths corresponding to said selected one of the talk-around and normal frequency ranges inputs the intermediate signal at the normal frequency range.

5. A transmitter according to claim 1, wherein:

the modulator modulates the desired signal to a third frequency range and outputs the modulated desired signal as the intermediate signal at the third frequency range;

the first transmission path inputs the intermediate signal at the third frequency range, modulates the intermediate signal to the normal frequency range, and outputs the intermediate signal at the normal frequency range, when the switch selects the normal frequency range; and the second transmission path inputs the intermediate signal at the third frequency range, modulates the intermediate signal to the talk-around frequency range, and outputs the intermediate signal at the talk-around frequency range, when the switch selects the talk-around frequency range.

6. A transmitter according to claim 1, wherein the modulator outputs the intermediate signal at the same frequency range to the first transmission path, when the switch selects the normal frequency range, as to the second transmission path, when the switch selects the talk-around frequency range.

7. A transmitter according to claim 6, wherein the modulator outputs the intermediate signal at the same normal frequency range.

8. A transmitter having a normal transmission mode in which a transmission signal is transmitted in a normal frequency band and a talk-around transmission mode in which the transmission signal is transmitted in a talk-around frequency band, comprising:

a modulation circuit to modulate an input signal to produce the transmission signal in the normal frequency band; and a band select circuit having a normal transmission path, a talk-around transmission path, and an RF switch coupling the modulation circuit to the normal transmission path and the talk-around transmission path, said normal transmission path outputting the transmission signal from the modulation circuit in the normal frequency band; and said talk-around transmission path having a talk-around frequency mixer and a fixed frequency local oscillator to modulate the signal output by the modulation circuit with a signal from the local oscillator to produce the transmission signal at a frequency in the talk-around frequency band.

9. A transmitter according to claim 8, wherein:

the modulation circuit includes:

an IF local oscillator operating at an intermediate frequency;

an I&Q modulator to accept the input signal and modulate the input signal with a signal from the IF local oscillator;

a second mixer to accept the signal output by the I&Q modulator; and a main local oscillator inputting a signal to the mixer to produce the transmission signal.

10. A transmitter according to claim 9, wherein the main local oscillator inputs the signal to the mixer at the normal frequency range incremented by the intermediate frequency.

11. A transmitter according to claim 9, wherein the main local oscillator is not in a feedback loop.

12. A transmitter according to claim 9, wherein the main local oscillator operates at the same frequency band to provide the when the RF switch couples the modulation circuit to the normal transmission path as when RF switch couples the modulation circuit to the talk-around transmission path.

13. A transmitter according to claim 9, wherein the main local oscillator inputs a signal to the second mixer to produce the transmission signal in only the normal frequency band.

14. A transmitter according to claim 8, wherein the modulation circuit includes a first stage having a modulator and an IF local oscillator to modulate the input signal to an intermediate frequency, and a second stage having a second mixer and a main local oscillator operating at a frequency in a range equal to the normal frequency range plus the IF local oscillator frequency.

15. A transmitter according to claim 14, wherein the main local oscillator operates only at a frequency in a range equal to the normal frequency range plus the IF local oscillator frequency.

16. A transmitter, comprising:

an I&Q modulator inputting I/Q input signals;

an IF local oscillator operating at an intermediate frequency and providing an intermediate frequency signal to the I&Q modulator for modulation with the I/Q input signals;

a first filter connected to an output of the I&Q modulator;

a first mixer connected to an output of the first filter;

a main local oscillator providing an RF signal to the first mixer to create a transmission signal in a normal frequency band;

a second filter connected to an output of the first mixer;

a normal transmission path; and a talk-around transmission path different from the normal transmission path, including:

a second mixer; and a talk-around local oscillator providing an RF signal to the second mixer to create a transmission signal in a talk-around frequency band different from the normal frequency band; and a third filter connected to an output of the second mixer; and a RF switch connected to an output of the second filter, and connected to the normal transmission path and the talk-around transmission path to connect one of said paths to the output of the second filter.

17. A method of transmitting desired signals in a selected one of two different frequency bands, comprising the steps of:

1) modulating the desired signal to an intermediate frequency;

2) mixing the signal from step 1) with a main local oscillator signal in a frequency band equal to one of the two different frequency bands incremented by the intermediate frequency;

3) switching the signal from step 2) to either a normal transmission path or a talk-around transmission path;

4) if in step 3), the signal from step 2) is switched to the normal transmission path, amplifying the signal from step 2), and then outputting the signal at said one of the two different frequency bands;

5) if in step 3), the signal from step 2) is switched to the talk-around transmission path, modulating the signal from step 2) to the other of said two different frequency bands, amplifying the modulated signal, and then outputting the amplified signal at said other of said two different frequency bands.

18. A transmitter for communicating with a remote mobile radio directly to the mobile radio at a talk-around frequency range or through a common base station at a normal frequency range, comprising:

a switch to select one of the talk-around or normal frequency ranges;

a modulator to input a desired signal, modulate the desired signal, and output the modulated desired signal as an intermediate signal at an intermediate frequency range;

a first transmission path, communicating with the modulator through the switch, to input the intermediate signal at the intermediate frequency range and to output the intermediate signal at the normal frequency range to the mobile radio, when the switch selects the normal frequency range;

a second transmission path, communicating with the modulator through the switch, to input the same intermediate signal at the same intermediate frequency range, modulate the intermediate signal to the talk-around frequency range, and output the intermediate signal at the talk-around frequency range to the common base station, when the switch selects the talk-around frequency range;

a transmission antenna to receive the intermediate signal at said one of the talk-around or normal frequency ranges from a corresponding one of the first or second transmission paths, and to transmit the received intermediate signal to a corresponding one of said base station and mobile radio.

19. A transmitter according to claim 18, wherein the first transmission path inputs the intermediate signal, modulates the intermediate signal to the normal frequency range, and outputs the intermediate signal at the normal frequency range.

20. A transmitter according to claim 18, wherein the modulator modulates the desired signal to the normal frequency range.

21. A transmitter according to claim 20, wherein one of said first and second transmission paths corresponding to said selected one of the talk-around and normal frequency ranges inputs the intermediate signal at the normal frequency range.

22. A transmitter according to claim 18, wherein:

the modulator modulates the desired signal to a third frequency range and outputs the modulated desired signal as the intermediate signal at the third frequency range;

the first transmission path inputs the intermediate signal at the third frequency range, modulates the intermediate signal to the normal frequency range, and outputs the intermediate signal at the normal frequency range, when the switch selects the normal frequency range; and the second transmission path inputs the intermediate signal at the third frequency range, modulates the intermediate signal to the talk-around frequency range, and outputs the intermediate signal at the talk-around frequency range, when the switch selects the talk-around frequency range.

23. A transmitter according to claim 18, wherein the modulator outputs the intermediate signal at the same frequency range to the first transmission path, when the switch selects the normal frequency range, as to the second transmission path, when the switch selects the talk-around frequency range.

24. A transmitter according to claim 23, wherein the modulator outputs the intermediate signal at the same normal frequency range.

* * * * *